(12) United States Patent
Junkins et al.

(10) Patent No.: US 9,380,722 B2
(45) Date of Patent: Jun. 28, 2016

(54) COMPUTING ASSEMBLY HAVING A MOVEABLE STORAGE BAY AND METHOD FOR PROVIDING THE SAME

(71) Applicant: Lenovo (Singapore) Pte. Ltd., New Tech Park, Singapore (SG)

(72) Inventors: Andrew Thomas Junkins, Cary, NC (US); Jonathan Randall Hinkle, Raleigh, NC (US)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 70 days.

(21) Appl. No.: 14/307,027

(22) Filed: Jun. 17, 2014

(65) Prior Publication Data

US 2015/0366095 A1    Dec. 17, 2015

(51) Int. Cl.
G06F 1/18     (2006.01)
H05K 5/02     (2006.01)
H05K 5/00     (2006.01)
H05K 7/14     (2006.01)

(52) U.S. Cl.
CPC ............. *H05K 5/0256* (2013.01); *G06F 1/18* (2013.01); *H05K 5/0004* (2013.01); *H05K 5/0221* (2013.01); *H05K 5/0226* (2013.01); *H05K 5/0239* (2013.01); *H05K 7/1487* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,495,389 A * | 2/1996 | Dewitt | G06F 1/18 | 220/255 |
| 5,566,383 A * | 10/1996 | Gildea | G06F 1/184 | 361/679.37 |
| 5,572,402 A * | 11/1996 | Jeong | G06F 1/184 | 361/679.31 |
| 5,584,396 A * | 12/1996 | Schmitt | H05K 7/16 | 211/26 |
| 5,701,231 A * | 12/1997 | Do | G06F 1/181 | 312/223.2 |
| 5,774,337 A * | 6/1998 | Lee | H05K 9/0049 | 361/679.31 |
| 5,784,251 A * | 7/1998 | Miller | G06F 1/182 | 361/679.6 |
| 5,784,252 A * | 7/1998 | Villa | G06F 1/184 | 361/679.58 |
| 5,973,918 A * | 10/1999 | Felcman | G06F 1/184 | 361/679.6 |
| 5,995,364 A * | 11/1999 | McAnally | G06F 1/187 | 361/679.31 |
| 6,404,625 B1 * | 6/2002 | Chen | G06F 1/187 | 312/223.1 |
| 6,445,576 B1 * | 9/2002 | Wooden | G06F 1/187 | 312/223.1 |
| 6,700,776 B2 * | 3/2004 | Bang | G06F 1/181 | 312/223.1 |
| 6,781,841 B2 * | 8/2004 | Kim | G06F 1/187 | 361/679.33 |
| 7,254,018 B2 * | 8/2007 | Zhang | G06F 1/187 | 312/223.2 |
| 7,257,827 B2 * | 8/2007 | Lee | G11B 33/022 | 312/223.2 |
| 7,352,576 B2 * | 4/2008 | McClure | G06F 1/20 | 361/610 |
| 7,433,183 B2 * | 10/2008 | Huang | G06F 1/187 | 312/223.2 |
| 8,427,835 B2 * | 4/2013 | Xu | G06F 1/187 | 174/69 |
| 8,462,502 B2 * | 6/2013 | Hirano | G06F 1/187 | 312/223.2 |
| 2002/0085347 A1 * | 7/2002 | Erickson | G06F 1/184 | 361/679.31 |
| 2005/0135068 A1 * | 6/2005 | Huff | H05K 7/186 | 361/724 |

* cited by examiner

*Primary Examiner* — Lisa Lea Edmonds
(74) *Attorney, Agent, or Firm* — Christopher R. Carroll; The Small Patent Law Group, LLC

(57) ABSTRACT

A computing assembly comprises an enclosure body having opposite first and second planar surfaces, one or more storage bays operably coupled with the enclosure body (where the one or more storage bays pivot relative to the enclosure body to protrude outward from the first planar surface of the enclosure body), one or more computing node devices at least partially disposed within the enclosure body (where the one or more computing node devices include one or more circuits) and one or more memory devices disposed within the one or more storage bays.

22 Claims, 5 Drawing Sheets

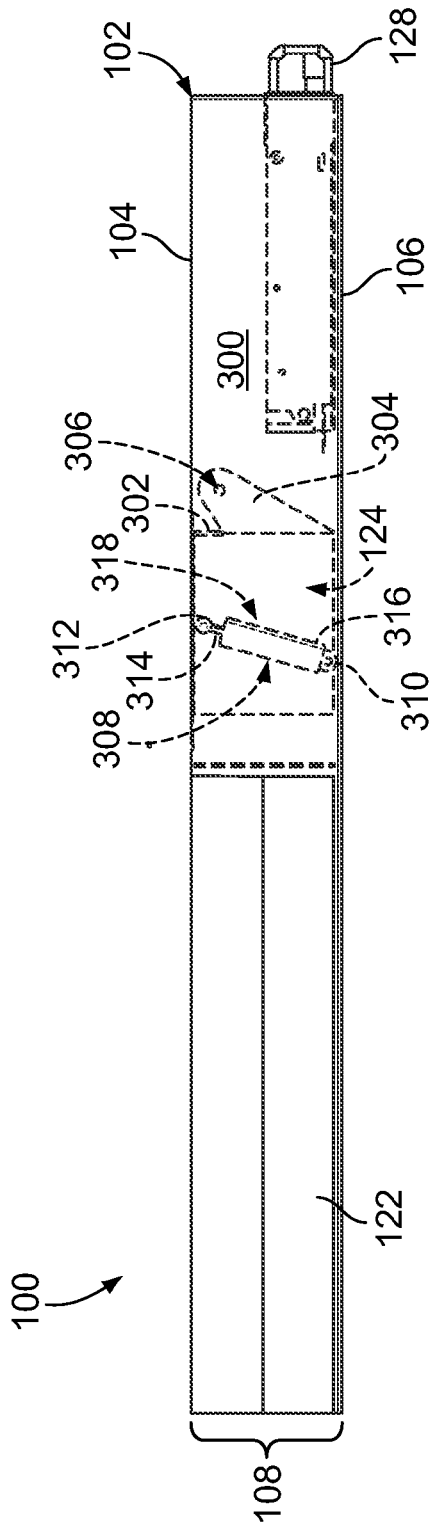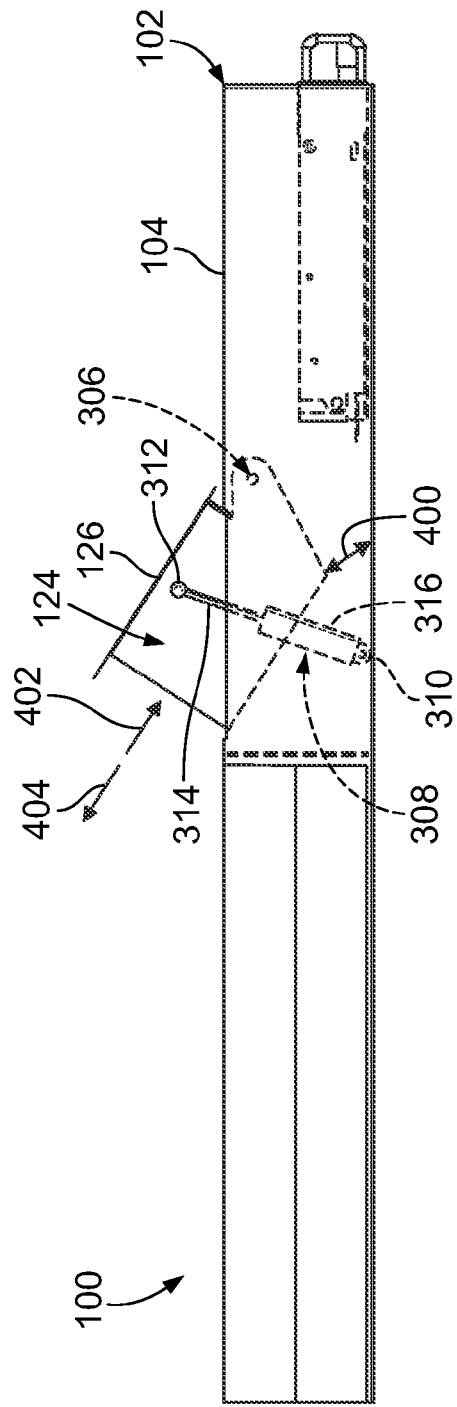

COMPUTING ASSEMBLY HAVING A MOVEABLE STORAGE BAY AND METHOD FOR PROVIDING THE SAME

FIELD

Embodiments of the subject matter described herein relate to computing assemblies and systems.

BACKGROUND

Some computing systems include several computing components that operate to perform various processing functions. For example, computing systems such as laptop computers, desktop computers, servers, or the like, can include computer processors that communicate with memory devices to perform operations according to hard wired logic, software instructions, or a combination thereof.

Blade servers are one type of a computing system that includes a relatively thin enclosure with several computing components disposed in the blade servers. The enclosures of the blade servers may provide limited space for mounting components such as hard disk drives, processing modules, or the like, in the blade servers. Some blade servers include these types of components mounted on opposite ends of the blade servers so that the components are more easily accessible.

But, these blade servers may include space between the components on the opposite ends that is available for additional components. Due to the manner in which blade servers are mounted in racks of larger computing systems, however, this space may not be easily accessed. For example, accessing this interior space may involve removing components mounted to one or more ends of the blade servers. If these components are used for performing processing of a server, then adding or removing components to the interior of the blade server may involve taking the server off-line. As a result, this interior space may be left unused. As a result, the density of the components inside the blade servers may be limited.

BRIEF DESCRIPTION

In one embodiment, a computing assembly comprises an enclosure body having opposite first and second planar surfaces, one or more storage bays operably coupled with the enclosure body (where the one or more storage bays pivot relative to the enclosure body to protrude outward from the first planar surface of the enclosure body), one or more computing node devices at least partially disposed within the enclosure body (where the one or more computing node devices include one or more circuits) and one or more memory devices disposed within the one or more storage bays.

In another embodiment, another computing assembly includes an enclosure body having opposite first and second surfaces operably coupled by opposite third and fourth surfaces (where the first and second surfaces have larger surface areas than the third and fourth surfaces) and one or more storage bays operably coupled with the enclosure body such that the one or more storage bays pivot relative to the enclosure body and protrude out of the first surface to provide access into the one or more storage bays from outside of the enclosure body.

In another embodiment, another computing assembly comprises an enclosure body including a first planar surface and an opposite second planar surface operably coupled with each other by a surface selected from the group consisting of a first side surface, an opposite second side surface, a first end, and an opposite second end, and one or more storage bays operably coupled with the enclosure body such that the one or more storage bays pivot relative to the enclosure body. The one or more storage bays pivot relative to the enclosure body such that the one or more storage bays protrude out of the first planar surface and provide access to one or more interior portions of the one or more storage bays.

BRIEF DESCRIPTION OF THE DRAWINGS

The present inventive subject matter will be better understood from reading the following description of non-limiting embodiments, with reference to the attached drawings, wherein below:

FIG. 3 illustrates a side view of the computing assembly shown in FIG. 1 with the storage bay also shown in FIG. 1 in the closed position according to one embodiment;

FIG. 4 illustrates the computing assembly with the storage bay shown in FIG. 1 in the open position according to one embodiment;

DETAILED DESCRIPTION

Figure 1:
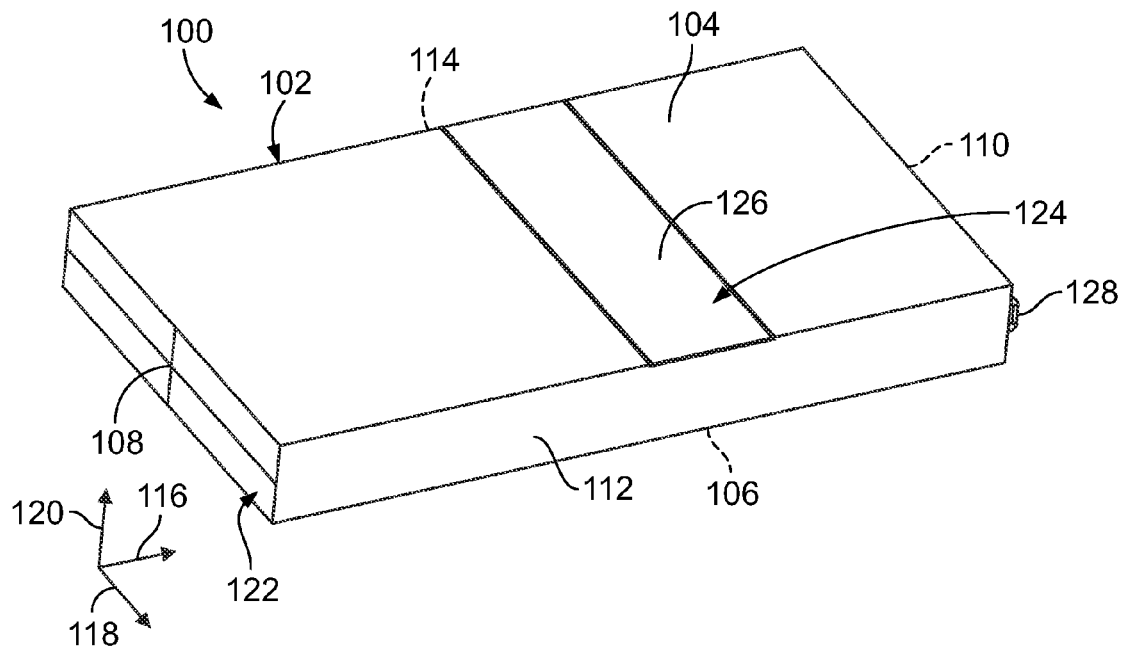
FIG. 1 illustrates a perspective view of a computing assembly according to one embodiment of the subject matter described herein.

FIG. 1 illustrates a perspective view of a computing assembly 100 according to one embodiment of the subject matter described herein. The computing assembly 100 includes an outer enclosure body 102 having opposite exterior surfaces 104, 106 connected with each other or separated from each other by opposite exterior ends 108, 110 and by opposite exterior side surfaces 112, 114. The surfaces 104, 106 may be separated from each other by the ends 108, 110 and by the side surfaces 112, 114 such that the enclosure body 102 defines an interior chamber (shown in FIG. 3). In the illustrated embodiment, the surfaces 104, 106 are planar or substantially planar surfaces. For example, the surfaces 104, 106 may have outer dimensions (e.g., length and width dimensions) that are larger in two dimensions than in a third dimension.

In FIG. 1, the surfaces 104, 106 are longer in directions that are parallel to an x-axis 116 and to a y-axis 118 than in directions that are parallel to a z-axis 120. The enclosure body 102 may be a relatively thin body in that the surfaces 104, 106 may be longer in directions that are parallel to the x- and y-axes 116, 118 than the ends 108, 110 and/or side surfaces 112, 114 are in directions that are parallel to the z-axis 120.

The surface 104 and/or 106 may have a larger surface area than the surface area of the end 108, the end 110, the side surface 112, and/or the side surface 114. The end 108 and/or the end 110 can represent open areas through which the interior of the enclosure body 102 can be access. Optionally, one or more of the end 108 and/or the end 110 can be a planar surface of material, similar to the surface 104, the surface 106, the surface 112, and/or the surface 114.

The enclosure body 102 may hold one or more computing components within the interior space defined by the enclosure body 102. For example, the enclosure body 102 may be a cover for a blade server assembly that includes one or more computing components. By way of example only, these components can include one or more circuit boards, one or more processors (e.g., computer processors, such as microprocessors or other electronic based logic-devices), one or more memory devices, one or more heat sinks, one or more batteries, one or more power connectors, or the like.

The illustrated example of the computing assembly 100 represents a blade server assembly that can be placed into a blade server rack to perform one or more computing operations. The end 108 can represent a front surface of the assembly 100 that is visible when the assembly 100 is placed into the blade server rack. The end 108 optionally may include or represent an open area through which the interior of the enclosure body 102 may be accessed. For example, edges of the larger surfaces 104, 106 and edges of the side surfaces 112, 114 may extend around (e.g., frame) the end 108 and define an opening into the enclosure body 102. The opposite end 110 can represent a back surface of the assembly 100 that includes one or more connectors for conductively coupling the assembly 100 with one or more other computing devices (e.g., connectors that couple several blade servers together). Optionally, the assembly 100 may be another type of computing device.

The enclosure body 102 may include one or more computing node devices 122 in the front end surface 108. The node devices 122 can include or represent modules, circuits, units, or the like, of the blade server assembly that perform various operations of the blade server assembly (e.g., gate arrays). For example, the node devices 112 can represent one or more hardware circuits or circuitry that include and/or are connected with one or more processors (e.g., computer microprocessors). The node devices 122 may be removable from the enclosure body 102 through the front end 108.

One or more power devices 128 may conductively couple with connectors, cables, wires, or the like, to supply electric power to the computing assembly 100. The power devices 128 can include electrical components that divide, modify, or otherwise supply power from an external source to the computing assembly 100. Optionally, the power devices 128 may include a source of electric current, such as one or more batteries.

The assembly 100 includes a storage bay 124 that is operably connected with the enclosure body 102. By "operably connected," it is meant that the storage bay 124 is connected with the enclosure body 102 such that the storage bay 124 can move relative to the enclosure body 102. For example, the storage bay 102 may open and close to provide access into the enclosure body 102. The storage bay 124 can be manually or automatically actuated to open up so that one or more components can be removed from the computing assembly 100 and/or added to the computing assembly 100. The storage bay 124 includes an exposed surface 126 that faces in a common direction as the larger surface 104 of the enclosure body 102.

In one embodiment, the exposed surface 126 may be co-planar with the larger surface 104 of the enclosure body 102. Alternatively, the exposed surface 126 may be parallel to, but not co-planar with, the larger surface 104. For example, the exposed surface 126 may be recessed within the enclosure body 102 or at least slightly protrude from the larger surface 104. Alternatively, the exposed surface 126 may be disposed at an acute angle with respect to the larger surface 104.

Figure 2:
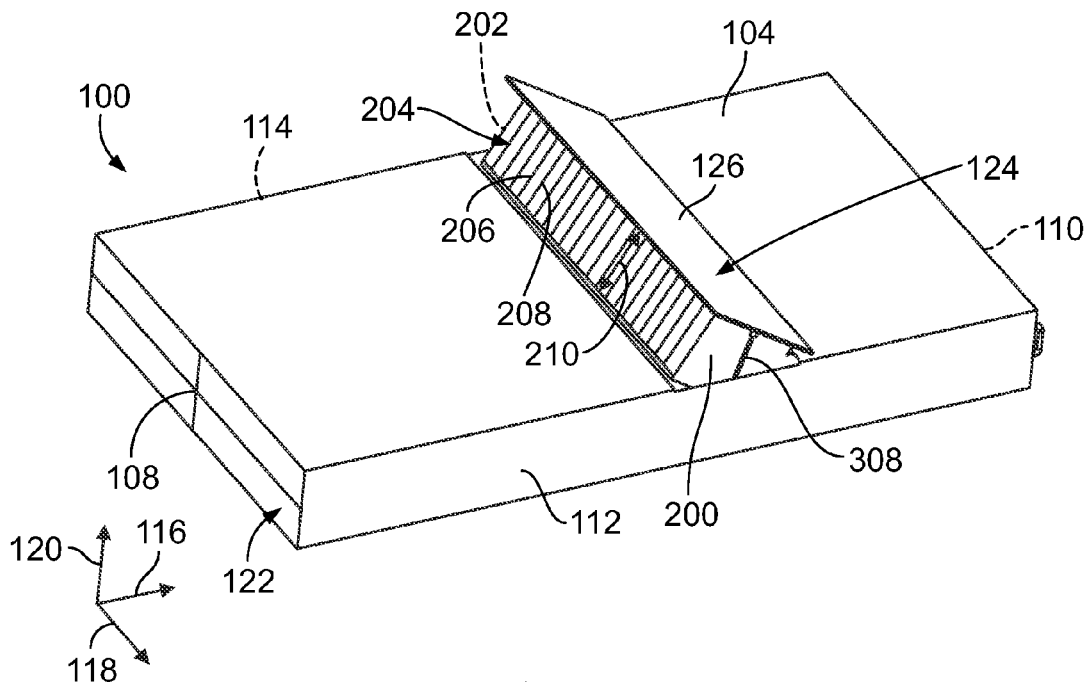
FIG. 2 illustrates another perspective view of the computing assembly shown in FIG. 1 with a storage bay shown in FIG. 1 in an open position according to one embodiment.

FIG. 2 illustrates another perspective view of the computing assembly 100 with the storage bay 124 in an open position according to one embodiment. The storage bay 124 can be actuated to provide access to one or more components of the computing assembly 100. For example, when the storage bay 124 is in the closed position or state shown in FIG. 1, the interior of the storage bay 124 may not be accessible through the larger surface 104. But, after actuating the storage bay 124 to the open position or state shown in FIG. 2, the interior of the storage bay 124 is accessible.

The storage bay 124 includes opposite side surfaces 200, 202. These side surfaces 200, 202 may not be viewable outside of the enclosure body 102 when the storage bay 124 is in the closed position shown in FIG. 1, but may be viewable when the storage bay 124 is opened, as shown in FIG. 2. Optionally, the storage bay 124 may include no side surfaces 200, 202, only one side surface 200 or 202, a greater number of side surfaces 200, 202, and/or one or more of the side surfaces 200, 202 in another location than what is shown in FIG. 3. An absorbing device 308 is connected with the storage bay 124, as described below. This absorbing device 308 can absorb forces imparted on computing components in the storage bay 124, such as by reducing the magnitude of mechanical shocks, vibrations, or the like, that may be imparted on the computing components in the storage bay 124 when the storage bay 124 is opened or closed. While a single storage bay 124 is shown in FIGS. 1 and 2, optionally, the computing assembly 100 may include two or more storage bays 124.

In the illustrated example, the storage bay 124 is opened to provide access to several computing components 204. These computing components 204 can include memory devices, such as hard disk drives (HDD), electrically erasable programmable read only memories (EEPROM), dynamic random access memories (DRAM), optical disc drives, flash memory drives, or the like. Optionally, the computing components 204 may include other types of devices, such as input/output cards, circuit boards, processing modules, or the like.

After the storage bay 124 is opened as shown in FIG. 1, one or more of the components 204 may be removed. For example, a user can grasp and remove one or more of the HDDs from the storage bay 124. A replacement component 204 may then be inserted into the storage bay 124, or the storage bay 124 can be returned to the closed position shown in FIG. 1 without replacing the removed component 204. In one embodiment, the components 204 may be conductively coupled with other components of the computing assembly 100 even when the storage bay 124 is opened (e.g., with the node devices 122) so that the computing assembly 100 can continue performing one or more operations during the time period that the storage bay 124 is open.

In the illustrated example, the storage bay 124 opens by pivoting to reveal the computing components 204. Prior to opening the storage bay 124, the exposed surface 126 of the storage bay 124 may be parallel or substantially parallel (e.g., more parallel than not) to the larger surface 104 of the enclosure body 102, as shown in FIG. 1. After opening the storage bay 124, the exposed surface 126 of the storage bay 124 may be oriented at an acute angle with respect to the larger surface 104 of the enclosure body 102. The storage bay 124 may pivot or otherwise rotate in order to open, which can cause the surface 126 of the storage bay 124 to be angled as shown in FIG. 2.

In the illustrated example, the storage bay 124 pivots such that the storage bay 124 transitions from being recessed into or otherwise disposed inside the enclosure body 102 to extending upward or otherwise protruding from the larger surface 104, as shown in FIG. 2. In another embodiment, the storage bay 124 may pivot such that the storage bay 124 opens to provide access to the components 204 without the storage bay 124 protruding from the enclosure body 102.

Alternatively, the storage bay 124 may open in another manner, such as by rising in a direction that is parallel to the z-axis 120. For example, instead of pivoting between the positions shown in FIGS. 1 and 2, the storage bay 124 may vertically rise in an elevator-like motion to provide access to the components 204. Optionally, a combination of pivoting and rising motions of the storage bay 124 may occur in order to provide access to the components 204.

The computing components 204 may have dimensions that correspond with the interior size of the storage bay 124. For example, the computing components 204 may have height dimensions 210 that allow the components 204 to be received in the storage bay 124. As shown in FIG. 2, the computing components 204 may be relatively thin components that can be arranged side-by-side in the storage bay 124. For example, the computing components 204 may have opposite side surfaces 206, 208 that are separated from a smaller distance in directions parallel to the x-axis 116 than the height dimensions 210 of the components 204. The computing components 204 may be arranged side-by-side in the storage bay 124 such that the side surfaces 206, 208 of the computing components 204 can face or engage one or more side surfaces 206, 208 of one or more other computing components 204, as shown in FIG. 2.

FIG. 3 illustrates a side view of the computing assembly 100 with the storage bay 124 in the closed position according to one embodiment. The computing assembly 100 is shown in FIG. 3 with the side surface 112 removed from the enclosure body 102. The enclosure body 102 extends around and defines an interior chamber 300 of the computing assembly 100. The node devices 122 are disposed in this chamber 300, and may be added to or removed from the chamber 300 through the end 108 of the enclosure body 102. The storage bay 124 is disposed within this chamber 300.

The storage bay 124 includes a coupler 302 to which the computing components 204 are connected. In the illustrated example, the coupler 302 is transversely oriented with respect to the larger surface 104 and/or the larger surface 106 of the enclosure body 102. For example, the coupler 302 may be parallel or substantially parallel to the end 108 and/or the end 110, and/or may be perpendicular or substantially perpendicular to the larger surface 104 and/or the larger surface 108.

The coupler 302 can include one or more circuit boards having one or more conductive terminals, connectors, or the like, that engage (or are engaged by) corresponding terminals, connectors, or the like, of the computing components 204. This connection can allow for electronic communication between the computing components 204 in the bay 124, and/or between the computing components 204 and one or more other devices (e.g., the node devices 122). For example, the computing components 204 may include terminals, contacts, or the like, on a back side of the components 204. This back side may be opposite to the sides of the computing components 204 that are visible in FIG. 2. Alternatively, the coupler 302 may represent a connector, cable, or the like, that couples with the components 204.

The storage bay 124 includes a pivot arm 304 that is rotatably connected to the enclosure body 102 at a pivot axis 306. The pivot arm 304 may be connected with one or more protrusions, pins, or the like, about which the pivot arm 304 can at least partially pivot or rotate. The pivot axis 306 is oriented normal to the plane of FIG. 3 such that the pivot axis 306 appears as a point in FIG. 3. For example, the pivot axis 306 may be oriented parallel to the x-axis 118, the end 108, the end 110, the surface 104, and/or the surface 106.

Optionally, the storage bay 124 may not include the arm 304, the arm 304 may be shaped differently, the arm 304 may be located elsewhere on the storage bay 124, the pivot axis 304 may be located elsewhere, or the like. In another embodiment, the pivot arm 304 may be connected to another component or body in the enclosure body 102.

The pivot axis 306 is disposed away from a center 318 of the side surfaces 200, 202 of the storage bay 124. One or more of the pivot arms 304 protrude from one or more of the side surfaces 200, 202 such that pivoting of the storage bay 124 causes the storage bay 124 to rise above the larger surface 104 of the enclosure body 102 and at least partially protrude from the enclosure body 102.

Alternatively, the pivot axis 306 may be disposed at or closer to centers of the side surfaces 200, 202 such that pivoting of the storage bay 124 about the pivot axis 306 causes the storage bay 124 to rise above the larger surface 104 by a smaller distance, protrude from the enclosure body 102 by a lesser amount, to not rise above the larger surface 104, or to not protrude from the enclosure body 102.

The computing assembly 100 includes the absorbing device 308 connected with the storage bay 124. The absorbing device 308 also is partially viewable in FIG. 2. The absorbing device 308 reduces mechanical shock, vibrations, and the like, that occur when the storage bay 124 is opened or closed. For example, without dampening the shock or vibrations, the storage bay 124 may be opened or closed forcefully, which could shake, vibrate, or shock the computing components 204 with sufficient force that the computing components 204 are damaged, operations of the computing components 204 are interfered with, or the like. The absorbing device 308 can reduce the forces imparted on the storage bay 124 and/or the computing components 204 when the storage bay 124 is opened or closed. In one aspect, the absorbing device 308 can include a spring, pneumatic dampener, pneumatic piston, or the like, or a combination of springs, dampeners, pistons, or the like.

Optionally, the absorbing device 308 can provide an auto-opening action for the storage bay 124. For example, when the storage bay 124 is pushed, pulled, or otherwise actuated, the absorbing device 308 can automatically extend to open the storage bay 124, instead of requiring an operator to complete the opening of the storage bay 124. Alternatively, one or more components (e.g., a server rack chassis, a body connected to the chassis, other blade servers, or the like) may engage the storage bay 124 and prevent the storage bay 124 from opening. When the computing apparatus 100 is moved, such as by removing the computing apparatus 100 from the rack, and the storage bay 124 is no longer engaged by these one or more components, then the absorbing device 308 can automatically open the storage bay 124. The absorbing device 308 can exert forces onto the enclosure body 102 and the storage bay 124 to support the mass or weight of the storage bay 124 in the open position to facilitate installation, removal, or replacement of computing devices 204. The absorbing device 308 can keep the storage bay 124 open until an operator closes the storage bay 124.

The absorbing device 308 illustrated in FIG. 3 is extended between opposite ends 310, 312, with one end 310 connected with the enclosure body 102 or another component, and the end 312 connected with the storage bay 124. The absorbing device 308 may include a piston 314 that extends from or retracts into a cylinder 316. The piston 314 may be pneumatically controlled to slow movement in and out of the cylinder 316. Optionally, the absorbing device 308 may include a spring or other device.

With continued reference to the computing assembly 100 shown in FIG. 3, FIG. 4 illustrates the computing assembly 100 with the storage bay 124 in the open position according to one embodiment. When the storage bay 124 is opened, the storage bay 124 can pivot about the axis 306 along an arcuate path 400. For example, the storage bay 124 may partially rotate around the axis 306 so that the surface 126 of the storage bay 124 is oriented at an acute angle with respect to the larger surface 104 of the enclosure body 102. In the open position, the components 204 may be added to and/or removed from the storage bay 124 along directions indicated by arrows 402, 404 in FIG. 4.

The absorbing device 308 extends from the state of the absorbing device 308 shown in FIG. 3 when the storage bay 124 is closed, to the state of the absorbing device 308 shown in FIG. 4 when the storage bay 124 is opened. The piston 314 of the absorbing device 308 can telescope from the cylinder 316 of the absorbing device 308 when the storage bay 124 opens. The movement of the piston 314 can be slowed by a pneumatic coupling between the piston 314 and the cylinder 316. For example, extending the piston 314 out of the cylinder 316 can be slowed by the flow of air or another fluid into or out of a chamber inside the cylinder 316.

Similarly, when the storage bay 124 is closed from the open position, the piston 314 may retract into the cylinder 316. The movement of the piston 314 into the cylinder 316 may be slowed by the flow of air or another fluid into or out of the chamber inside the cylinder 316. Alternatively, the piston 314 may be coupled with a spring inside the cylinder 316 that slows movement of the piston 314 relative to the cylinder 316. In another embodiment, an elastic or otherwise compressible body may be connected with the piston 314 to slow movement of the piston 314. Alternatively, a spring or other device that slows the movement of the storage bay 124 may be used in place of the absorbing device 308. For example, a spring may be connected between the locations where the ends 310, 312 of the device 308 are connected, and may partially resist opening and/or closing of the storage bay 124 in order to dampen shock, vibration, of the like, to the computing components 204.

In operation, when the storage bay 124 is opened, the absorbing device 308 slows down the speed at which the storage bay 124 pivots and/or prevents the storage bay 124 from a jarring action (e.g., a sudden stoppage of movement, such as when the storage bay 124 is abruptly stopped from further pivoting). Similarly, when the storage bay 124 is closed, the absorbing device 308 can slow down the speed at which the storage bay 124 pivots into the enclosure body 102 and/or prevent the storage bay 124 from a jarring action. This reduced pivoting speed can reduce the forces imparted onto the computing components 204 in the storage bay 124.

Figure 5:
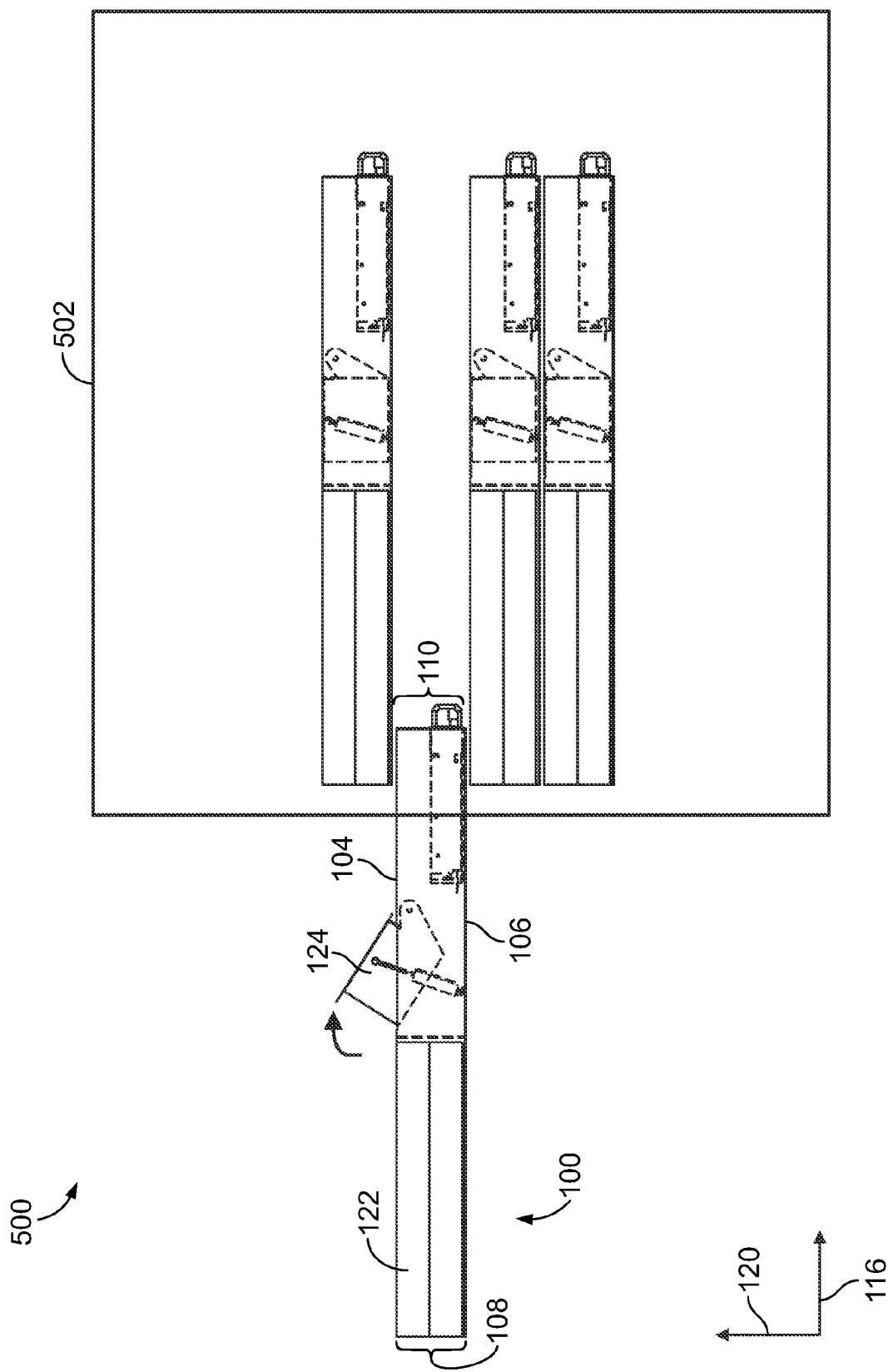
FIG. 5 illustrates a computing system that includes several computing assemblies shown in FIG. 1 according to one embodiment.

FIG. 5 illustrates a computing system 500 that includes several computing assemblies 100 according to one embodiment. The computing system 500 includes a housing 502, such as a blade enclosure (e.g., a blade server chassis), in which the computing assemblies 100 are mounted. In order to add, remove, or swap out one or more computing components 204 (shown in FIG. 2) from a computing assembly 100, the computing assembly 100 may be at least partially removed from the housing 502 and the storage bay 124 may be opened, as shown in FIG. 5.

During the time period that one or more computing components 204 are removed from the computing assembly 100, other computing components 204 in the same computing assembly 100 can continue to operate. For example, because the computing components 204 remain coupled with the coupler 302 (shown in FIG. 3) in the computing assembly 100 during removal of another computing component 204, the computing components 204 that remain connected with the coupler 302 can continue to operate as the components 204 operated prior to opening the storage bay 124. The removal and/or replacement of a computing component 204 while other computing components 204 continue to operate can be referred to as "hot swapping" the computing component 204. For example, while the storage bay 124 is closed, is in the process of moving relative to the enclosure body 102, and/or is opened, the node devices 122 can continue to perform processing operations of data stored on one or more of the computing components 204.

The relatively thin size of the computing assemblies 100 allows several the computing assemblies 100 to be mounted within the housing 502 of the computing system 500. The housing 502 can include one or more conductive pathways (e.g., buses, wires, cables, or the like), to allow the computing components 204, node devices 122, or the like, in different computing assemblies 100 to electronically communicate with each other. In one embodiment, the computing assemblies 100 have relatively small dimensions in directions that are parallel to the z-axis 120.

For example, the opposite larger surfaces 104, 106 of the computing assemblies 100 may be separated from each other in a direction parallel to the z-axis 120 by 1.75 inches or less (e.g., 4.45 centimeters or less), 3.5 inches or less (e.g., 8.9 centimeters or less), by 10.5 inches or less (e.g., 26.7 centimeters or less), or another distance. In one aspect, the computing assemblies 100 and/or enclosure bodies 102 have a form factor of 2 U. For example, the surfaces 104, 106 may be separated from each other by no more than 1.75 inches. Alternatively, the computing assemblies 100 may have a form factor of 4 U or another form factor.

Due to the sizes of some computing components 204, such as HDDs, and/or the relatively thin dimensions of other known blade servers, the number of computing components 204 that can be placed into or otherwise coupled with these other known blade servers may be limited. Some computing components 204 may need to be mounted in the blade servers such that sides 206, 208 (shown in FIG. 2) of the components 204 are parallel to the larger sides or surfaces of the blade servers. For example, the computing components 204 may need to be mounted in the blade servers such that the side 206 or the side 208 is parallel to the circuit boards or motherboards in the blade servers. This causes the footprints of the computing components 204 to take up considerable space in the blade servers.

In contrast, vertically stacking the computing components 204 in the computing assemblies 100 as shown in FIG. 2 can increase a density in which the computing components 204 are provided in the assemblies 100. For example, more computing components 204 may be able to be loaded into the storage bay 124 by stacking the computing components 204 side-by-side in directions parallel to the x-axis 116, instead of mounting the computing components 204 in the enclosure bodies 102 such that the sides 206, 208 of the computing components 204 are parallel or substantially parallel to the larger surfaces 104, 106 of the enclosure bodies 102. Some known blade servers having a form factor of 2 U may be limited by only being able to fit around twelve HDDs or less in each of the blade servers. In contrast, one or more embodiments of the subject matter described herein may permit for at least twenty, at least twenty-five, at least thirty, or another number of the computing components 204 (e.g., HDDs or other components) to be mounted in a computing assembly 100.

The location of the storage bay 124 also can increase the density of the computing components 204 in a computing assembly 100, while allowing for relatively easy access to the computing components 204. For example, the space available for accessing the computing components 204 through the front end 108 and/or the back end 110 of the computing assembly 100 may be limited or blocked due to the presence of the node devices 122 and/or power devices 128.

Figure 6:
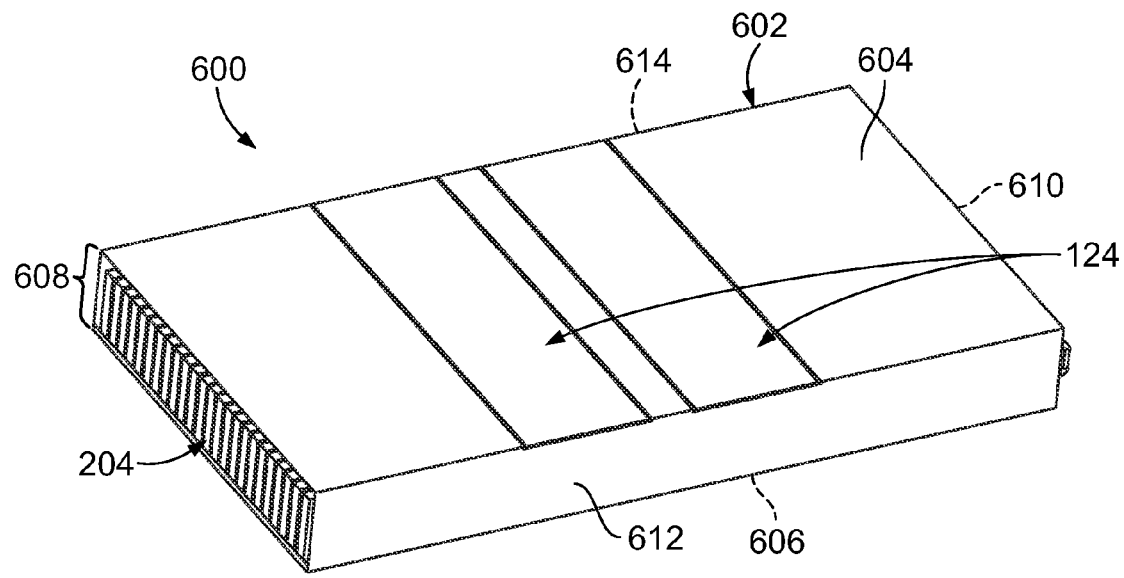
FIG. 6 illustrates a perspective view of a computing assembly according to another embodiment.

FIG. 6 illustrates a perspective view of a computing assembly 600 according to another embodiment. Similar to the computing assembly 100 shown in FIG. 1, the computing assembly 600 includes an outer enclosure body 602 having opposite larger surfaces 604, 606 connected with each other or separated by opposite ends 608, 610 and by opposite side surfaces 612, 614. The larger surfaces 604, 606 can be planar or substantially planar surfaces. For example, the larger surfaces 604, 606 may have outer dimensions (e.g., length and width dimensions) that are larger in two dimensions than in a third dimension, as described above in connection with the larger surfaces 104, 106 of the computing assembly 100.

The enclosure body 602 may hold one or more computing devices 204 within the enclosure body 602. For example, the computing assembly 600 may represent a relatively thin memory computing device, such as a JBOD (e.g., "Just a Box of Disks") that holds several HDDs or other memory devices. Alternatively, the computing assembly 600 may represent another type of computing device.

The front end 608 includes several computing devices 204 stacked side-by-side with each other. Optionally, the computing devices 204 may be arranged in another manner in the front end 608. In contrast to the computing assembly 100 shown in FIG. 1, the computing assembly 600 includes plural storage bays 124 that open and close to provide access to more computing devices 204. The storage bays 124 can be manually or automatically actuated to open up so that one or more computing components 204 can be removed from the computing assembly 600 and/or added to the computing assembly 600. In one embodiment, the storage bays 124 are independently moveable relative to the enclosure body 602. For example, one storage bay 124 may be opened while other storage bay(s) 124 remain closed. Optionally, multiple storage bays 124 or all of the storage bays 124 may open or close at the same time.

Figure 7:
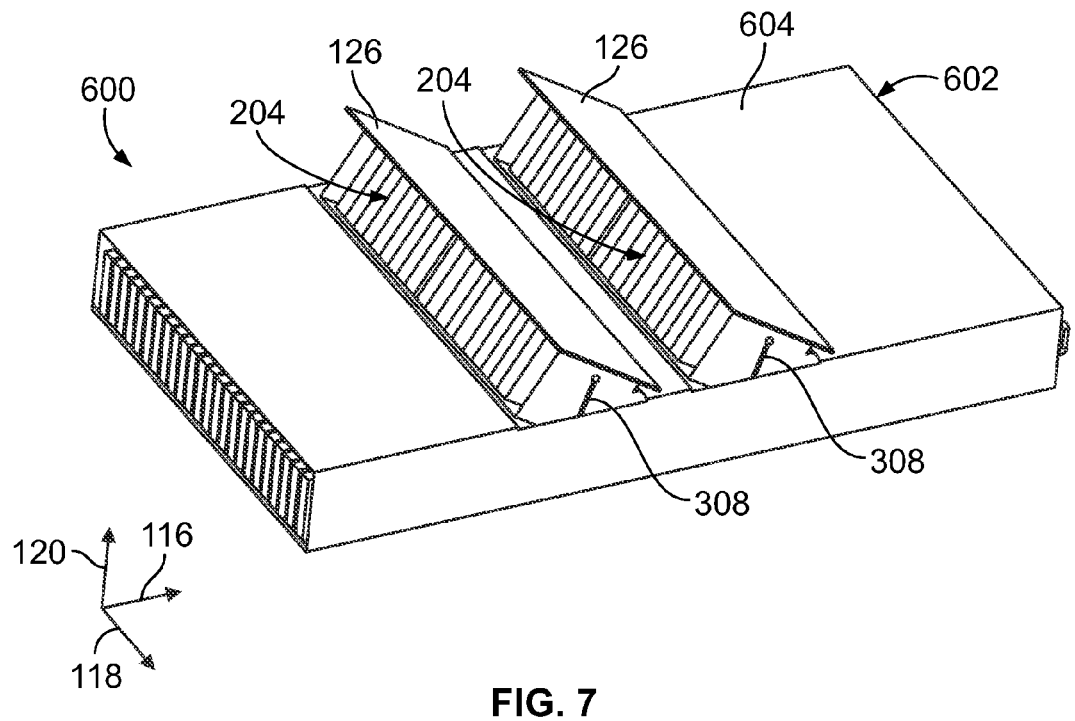
FIG. 7 illustrates another perspective view of the computing assembly shown in FIG. 6 with the storage bays in an open position according to one embodiment.

FIG. 7 illustrates another perspective view of the computing assembly 600 with the storage bays 124 in an open position according to one embodiment. As described above, the storage bays 124 can be actuated to pivot and provide access to several computing devices 204. While two storage bays 124 are shown, optionally, the computing assembly 600 may include a single storage bay 124, or may include more than two storage bays 124. One or more of the storage bays 124 can include the absorbing devices 308. As described above, these absorbing devices 308 can reduce the forces imparted to the computing components 204 in order to prevent or reduce mechanical damage or shock to the components 204.

The storage bays 124 can be opened (as shown in FIG. 7) to allow one or more of the components 204 to be removed and/or added to the computing assembly 600. For example, a user can grasp and remove one or more of the HDDs from one or more of the storage bays 124. A replacement component 204 may then be inserted into the storage bay 124, or the storage bay 124 can be returned to the closed position shown in FIG. 6 without replacing the removed component 204. The components 204 may be conductively coupled with other components of the computing assembly 600 even when the storage bay 124 is opened so that the computing assembly 100 can continue performing one or more operations during the time period that one or more of the storage bays 124 is open.

The storage bays 124 may open by pivoting to reveal the computing components 204. Prior to opening the storage bays 124, the exposed surfaces 126 of the storage bays 124 may be parallel or substantially parallel to the larger surface 604 of the enclosure body 602. After opening the storage bays 124, the exposed surfaces 126 of the storage bays 124 may be oriented at an acute angle with respect to the larger surface 604 of the enclosure body 602, and/or the storage bays 124 may protrude from the larger surface 604. Alternatively, the storage bays 124 may open in another manner, such as by rising in a direction that is parallel to the z-axis 120, by pivoting without protruding from the larger surface 604, or the like.

Figure 8:
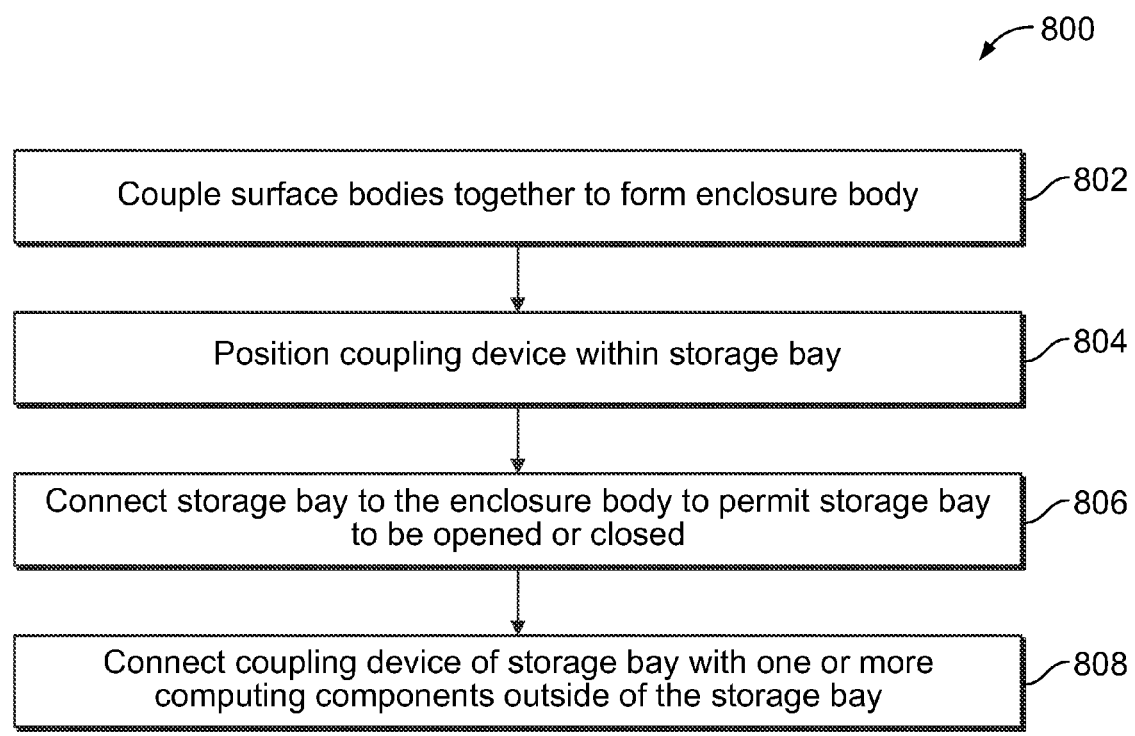
FIG. 8 illustrates a flowchart of a method for providing a computing assembly having a storage bay that can be opened or closed according to one embodiment.

FIG. 8 illustrates a flowchart of a method 800 for providing a computing assembly having a storage bay that can be opened or closed according to one embodiment. The method 800 may be used to manufacture one or more embodiments of the computing apparatuses described herein. The order in which the operations of the method 800 are described below and shown in FIG. 8 is not intended to be required or limiting. For example, the order of two or more of the operations may be switched around to be performed in another order, and/or one or more of the operations may be omitted.

At 802, bodies used to form one or more surfaces of the computing apparatus 100, 600 may be coupled to form the enclosure body 102, 602. For example, larger surfaces 104, 106 or 604, 606 may be connected with each other by one or more of the side surfaces 112, 114 or 612, 614 and/or one or more of the ends 108, 110 or 608, 610 to form the enclosure body 102 or 602. These bodies may be separate planar bodies formed from a dielectric material or conductive material, or may be bodies that are formed together (e.g., plastic molded parts having two or more of the surfaces 104, 106, 108, 110, 112, 114 or 604, 606, 608, 610, 612, 614 formed as a single body).

At 804, a coupler 302 is disposed within a storage bay 124. For example, a circuit board having one or more connectors or terminals is mounted within a storage bay 124 to be included in the computing apparatus 100, 600. At 806, the storage bay 124 is connected with the enclosure body 102, 602. The storage bay 124 can be connected with the enclosure body 102, 602 so as to allow the storage bay 124 to be opened. As described above, the storage bay 124 may be pivotally connected with the enclosure body 102, 602 such that the storage bay 124 can be pivoted to open the storage bay 124. Prior to opening the storage bay 124, the interior portion of the storage bay 124 may be inaccessible from locations outside of the enclosure body 102, 602. After opening the storage bay 124, this interior portion may be accessible to permit addition and/or removal of computing components 204 to or from the interior portion of the storage bay 124.

At 808, the coupler 302 in the storage bay 124 is connected with one or more computing components outside of the storage bay 124. For example, one or more wires, busses, or the like, may conductively couple the coupler 302 with one or more circuit boards or other electronic components disposed in the enclosure body 102, 602, but outside of the storage bay 124. In use, these circuit boards or other electronic components can be coupled with node devices 122 or other devices to permit the computing components 204 in the storage bay 124 to communicate with the node devices 122 or other devices.

As will be appreciated by one skilled in the art, various aspects may be embodied as a system, method, or computer (device) program product. Accordingly, aspects may take the form of an entirely hardware embodiment or an embodiment including hardware and software that may all generally be referred to herein as a "circuit," "module" or "system." Furthermore, aspects may take the form of a computer (device) program product embodied in one or more computer (device) readable storage medium(s) having computer (device) readable program code embodied thereon.

Any combination of one or more non-signal computer (device) readable medium(s) may be utilized. The non-signal medium may be a storage medium. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a dynamic random access memory (DRAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Aspects are described herein with reference to the figures, which illustrate example methods, devices and program products according to various example embodiments. These program instructions may be provided to a processor of a general purpose computer, special purpose computer, or other programmable data processing device or information handling device to produce a machine, such that the instructions, which execute via a processor of the device implement the functions/acts specified.

Although illustrative example embodiments have been described herein with reference to the accompanying figures, it is to be understood that this description is not limiting and that various other changes and modifications may be affected therein by one skilled in the art without departing from the scope or spirit of the disclosure.

The modules/applications/systems herein may include any processor-based or microprocessor-based system including systems using microcontrollers, reduced instruction set computers (RISC), application specific integrated circuits (ASICs), field-programmable gate arrays (FPGAs), logic circuits, and any other circuit or processor capable of executing the functions described herein. Additionally or alternatively, the modules/controllers herein may represent circuit modules that may be implemented as hardware with associated instructions (for example, software stored on a tangible and non-transitory computer readable storage medium, such as a computer hard drive, ROM, RAM, or the like) that perform the operations described herein. The above examples are exemplary only, and are thus not intended to limit in any way the definition and/or meaning of the term "controller." The modules/applications herein may execute a set of instructions that are stored in one or more storage elements, in order to process data. The storage elements may also store data or other information as desired or needed. The storage element may be in the form of an information source or a physical memory element within the modules/controllers herein. The set of instructions may include various commands that instruct the modules/applications herein to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

It is to be understood that the subject matter described herein is not limited in its application to the details of construction and the arrangement of components set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

It is to be understood that the above description is intended to be illustrative, and not restrictive. For example, the above-described embodiments (and/or aspects thereof) may be used in combination with each other. In addition, many modifications may be made to adapt a particular situation or material to the teachings herein without departing from its scope. While the dimensions, types of materials and coatings described herein are intended to define various parameters, they are by no means limiting and are illustrative in nature. Many other embodiments will be apparent to those of skill in the art upon reviewing the above description. The scope of the embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects or order of execution on their acts.

What is claimed is:

1. A computing assembly comprising:
   an enclosure body having opposite first and second planar surfaces;
   one or more storage bays operably coupled with the enclosure body, the one or more storage bays pivoting relative to the enclosure body to protrude outward from the first planar surface of the enclosure body, wherein the one or more storage bays pivot relative to the enclosure body about an axis located inside the enclosure body;
   one or more computing node devices at least partially disposed within the enclosure body, the one or more computing node devices including one or more circuits; and
   one or more memory devices disposed within the one or more storage bays.

2. The computing assembly of claim 1, wherein the one or more storage bays pivot relative to the enclosure body to protrude from the first surface and open to provide access to the one or more memory devices in the one or more storage bays from outside of the enclosure body.

3. The computing assembly of claim 1, further comprising one or more dampening assemblies that reduce forces imparted on the one or more memory devices inside the one or more storage bays when the one or more storage bays pivot relative to the enclosure body.

4. The computing assembly of claim 1, wherein the enclosure body includes a first side and an opposite second side operably coupled with the first and second planar surfaces, the enclosure body also including a first end and an opposite second end operably coupled with the first and second planar surfaces,
wherein the one or more storage bays pivot relative to the enclosure body about a location that is between the first end and the opposite second end, between the first planar surface and the second planar surface, and between the first side and the opposite second side such that the one or more storage bays protrude out of the first planar surface.

5. A computing assembly comprising:
an enclosure body having opposite first and second surfaces operably coupled by opposite third and fourth surfaces, the first and second surfaces having larger surface areas than the third and fourth surfaces; and
one or more storage bays operably coupled with the enclosure body such that the one or more storage bays pivot relative to the enclosure body to protrude out of the first surface to provide access into the one or more storage bays from outside of the enclosure body, wherein the one or more storage bays pivot relative to the enclosure body about an axis located inside the enclosure body.

6. The computing assembly of claim 5, further comprising one or more computing components disposed inside the one or more storage bays, the one or more storage bays pivoting relative to the enclosure body to provide access to the one or more computing components from outside of the enclosure body.

7. The computing assembly of claim 5, wherein the one or more storage bays independently move relative to the enclosure body.

8. The computing assembly of claim 5, wherein the one or more storage bays pivot into the enclosure body to prevent access into the one or more storage bays.

9. The computing assembly of claim 5, wherein the one or more storage bays include one or more surfaces that are oriented at one or more acute angles with respect to the first surface of the enclosure body as the one or more storage bays are opened.

10. The computing assembly of claim 9, wherein the one or more surfaces are oriented parallel or substantially parallel to the first surface of the enclosure body as the one or more storage bays are closed into the enclosure body.

11. The computing assembly of claim 4, further comprising one or more dampening assemblies operably coupled to the one or more storage bays and the enclosure body, the one or more dampening assemblies reducing forces imparted on one or more computing components disposed within the one or more storage bays as the one or more storage bays move relative to the enclosure body.

12. A computing assembly comprising:
an enclosure body including a first end, an opposite second end, and a first planar surface operably coupled with each other; and
one or more storage bays operably coupled with the enclosure body such that the one or more storage bays pivot relative to the enclosure body, the one or more storage bays pivoting relative to the enclosure body in a location between the first end and the opposite second end such that the one or more storage bays protrude out of the first planar surface and provide access to one or more interior portions of the one or more storage bays, wherein the one or more storage bays pivot relative to the enclosure body about an axis located inside the enclosure body.

13. The computing assembly of claim 12, further comprising one or more removable computing components disposed in the one or more storage bays.

14. The computing assembly of claim 12, wherein the one or more storage bays pivot relative to the enclosure body to open the one or more storage bays and provide access to one or more removable computing components in the one or more storage bays from outside of the enclosure body.

15. The computing assembly of claim 12, wherein the one or more storage bays pivot into the enclosure body to prevent access to the one or more interior portions of the one or more storage bays.

16. The computing assembly of claim 15, wherein the one or more storage bays cease protruding outside of the enclosure body responsive to the one or more storage bays pivoting into the enclosure body.

17. The computing assembly of claim 12, further comprising one or more dampening assemblies operably coupled to the one or more storage bays and the enclosure body, the one or more dampening assemblies reducing forces imparted on one or more computing components disposed within the one or more storage bays caused by movement of the one or more storage bays relative to the enclosure body.

18. The computing assembly of claim 12, wherein the one or more storage bays are disposed between the first end and the opposite second end of the enclosure body.

19. The computing assembly of claim 12, wherein the enclosure body forms at least part of a blade server computing assembly.

20. The computing assembly of claim 12, wherein the one or more storage bays include one or more couplers that engage one or more removable computing components in the one or more storage bay.

21. The computing assembly of claim 12, further comprising one or more computing node devices disposed in the first end of the enclosure body and one or more computing components disposed in the one or more storage bays, the one or more computing node devices performing processing of data using data stored on the one or more computing devices while the one or more storage bays move relative to the enclosure body.

22. The computing assembly of claim 12, wherein the enclosure body includes a second planar surface that is opposite the first planar surface, a first side, and an opposite second side operably coupled with each other, wherein the one or more storage bays pivot relative to the enclosure body in the location that is between the first end and the opposite second end, between the first planar surface and the second planar surface, and between the first side and the opposite second side such that the one or more storage bays protrude out of the first planar surface.

* * * * *